United States Patent
Riess et al.

(10) Patent No.: US 8,710,590 B2
(45) Date of Patent: Apr. 29, 2014

(54) ELECTRONIC COMPONENT AND A SYSTEM AND METHOD FOR PRODUCING AN ELECTRONIC COMPONENT

(75) Inventors: Philipp Riess, Munich (DE); Henning Feick, Dresden (DE); Martin Wendel, Hohenbrunn (DE)

(73) Assignee: Infineon Technologies AG, Munich (DE)

( * ) Notice: Subject to any disclaimer, the term of this patent is extended or adjusted under 35 U.S.C. 154(b) by 840 days.

(21) Appl. No.: 11/454,996

(22) Filed: Jun. 16, 2006

(65) Prior Publication Data

US 2007/0010077 A1 Jan. 11, 2007

(30) Foreign Application Priority Data

Jun. 22, 2005 (DE) .................. 10 2005 028 919

(51) Int. Cl.
*H01L 23/62* (2006.01)

(52) U.S. Cl.
USPC ........... 257/360; 257/361; 257/362; 257/173; 257/355; 257/127; 257/452; 257/546; 257/409; 257/483

(58) Field of Classification Search
USPC ......... 257/280, 355–357, 360–362, 173, 452, 257/546, 127, 409, 483–483, 605–606, 257/E29.012–E29.015
See application file for complete search history.

(56) References Cited

U.S. PATENT DOCUMENTS

| 5,341,005 A * | 8/1994 | Canclini ........................ 257/173 |
| 5,545,909 A * | 8/1996 | Williams et al. .............. 257/355 |
| 5,559,352 A | 9/1996 | Hsue et al. |
| 6,171,891 B1 | 1/2001 | Lee et al. |
| 6,268,639 B1 * | 7/2001 | Li et al. .......................... 257/577 |
| 6,472,286 B1 * | 10/2002 | Yu ................................. 438/342 |
| 6,514,839 B1 | 2/2003 | Ker et al. |
| 6,696,727 B2 | 2/2004 | Takahara |
| 6,788,507 B2 | 9/2004 | Chen et al. |
| 7,075,156 B1 * | 7/2006 | Li et al. .......................... 257/355 |
| 2002/0063289 A1 * | 5/2002 | Su et al. ......................... 257/355 |
| 2003/0006464 A1 * | 1/2003 | Heyn et al. ..................... 257/362 |
| 2003/0227053 A1 | 12/2003 | Nomura et al. |
| 2004/0043568 A1 | 3/2004 | Ker et al. |
| 2005/0224882 A1 * | 10/2005 | Chatty et al. ................... 257/355 |

OTHER PUBLICATIONS

People's Republic of China First Office Action, English translation, 3 pgs.

Jan M. Rabaey et al. International Edition, "*Digital Integrated Circuits, A Design Perspective*", Second Edition, Prentice Hall Electronics and VLSI Series, Charles G. Sodini, Series Editor, p. 458.

D. Widmann et al., "*Technologie hochintegrierter Schaltungen*" [Technology of highly integrated circuits], Springer, 2nd edition, 1996, pp. 233-234.

* cited by examiner

*Primary Examiner* — Steven Loke
*Assistant Examiner* — Cuong B Nguyen

(57) ABSTRACT

In a method for producing an electronic component, a substrate is doped by introducing doping atoms. In the doped substrate, at least one connection region of the electronic component is formed by doping with doping atoms. Furthermore, at least one additional doped region is formed at least below the at least one connection region by doping with doping atoms. Furthermore, at least one well region is formed in the substrate by doping with doping atoms in such a way that the well region doping is blocked at least below the at least one additional doped region.

14 Claims, 11 Drawing Sheets

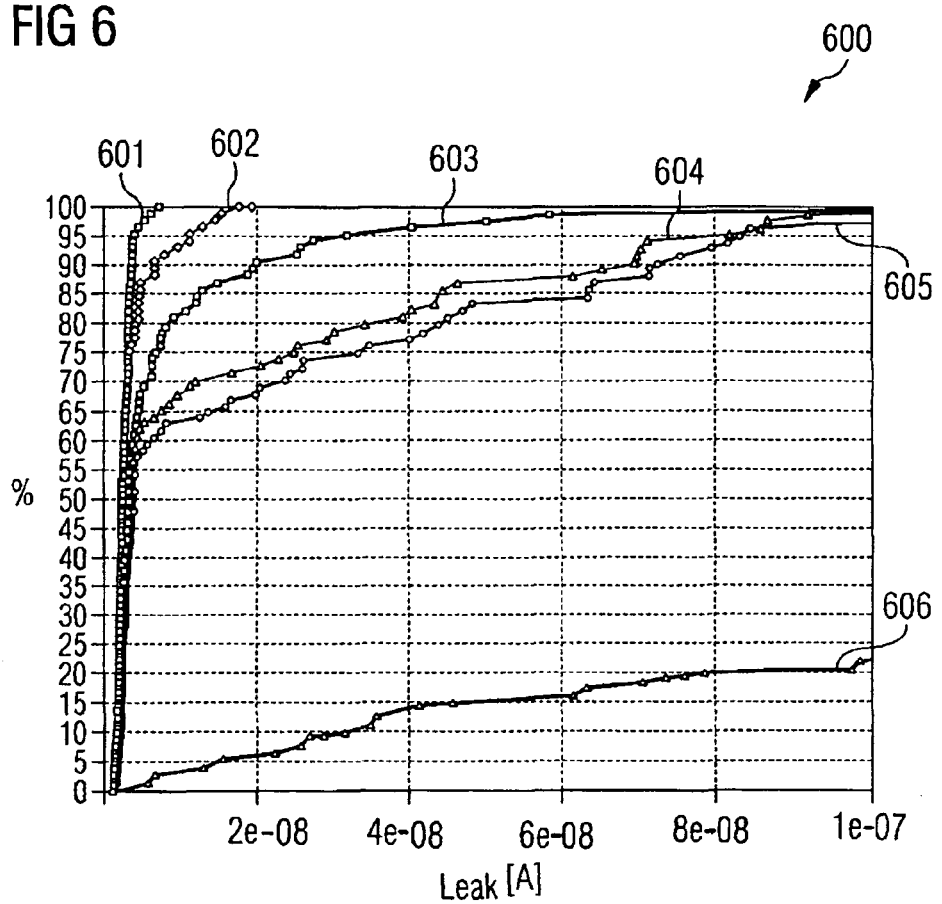

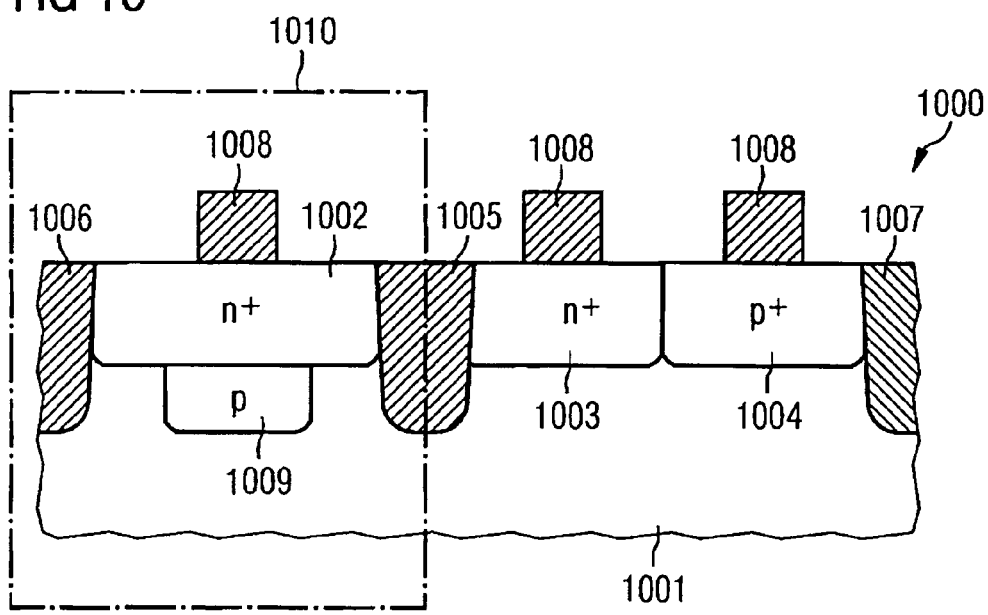

ELECTRONIC COMPONENT AND A SYSTEM AND METHOD FOR PRODUCING AN ELECTRONIC COMPONENT

RELATED APPLICATIONS

The present application claims priority to German Application No DE 10 2005 028 919.3-33, filed Jun. 22, 2005, the entirety of which is hereby incorporated herein by reference.

TECHNICAL FIELD

The invention relates to a method for producing an electronic component and an electronic component.

BACKGROUND OF THE INVENTION

It is desirable to prevent electrostatically generated voltage spikes from occurring during fabrication of electronic components.

This is done on the one hand, by means of known electrostatic protective measures such as, by way of example, electrically conductive work surfaces, antistatic strips, appropriate furniture, clothing, floor covering, ionized ambient air or grounding.

On the other hand, electronic components such as transistors, for example, that are to be protected against ESD often contain one or more additional doped regions (also called ESD regions or ESD implantations hereinafter) for improving the protective effect against electrostatic discharges. In the case of a field effect transistor (FET) ESD implantations are usually introduced on the source/drain regions and the contacts of the transistor to be improved (so-called contact hole implantation).

SUMMARY OF THE INVENTION

In a method for producing an electronic component, a substrate is doped by means of introducing doping atoms. Furthermore, at least one connection region of the electronic component is formed in the substrate by means of doping with doping atoms and at least one additional doped region is formed at least below the at least one connection region by means of doping with doping atoms, the at least one additional doped region being formed as an ESD region, which ESD region serves for protection against electrostatically generated discharges. Furthermore, at least one well region is formed in the substrate by means of doping with doping atoms, the well region doping being blocked at least below the at least one additional doped region in such a way that the doping intensity in each region blocked from the well region doping corresponds to the doping intensity of the substrate at the end of the method.

Furthermore, an electronic component is provided. The electronic component has a doped substrate, and also a connection region formed by means of doping with doping atoms. Furthermore, the electronic component has at least one additional doped region formed at least below the at least one connection region. The at least one additional doped region is formed as an ESD region for protection against electrostatically generated discharges. Furthermore, the electronic component has at least one well region formed by means of doping with doping atoms, said well region being formed in such a way that the well region doping is blocked at least below the at least one additional doped region.

BRIEF DESCRIPTION OF THE FIGURES

Exemplary configurations of the invention are illustrated in the figures and explained in more detail below. In the figures, identical or similar elements are provided with identical reference symbols, in so far as is expedient.

In the figures:

FIG. 6 shows a distribution of a the leakage current in n-channel field effect transistors with ESD implantation and various production processes;

FIG. 10 shows a schematic construction of one embodiment of a bipolar transistor.

DETAILED DESCRIPTION OF THE INVENTION

The configurations of the invention described below relate both to a method for producing an electronic component and to an electronic component.

It is provided that the at least one additional region doped by means of doping with doping atoms is formed as an ESD region, which ESD region serves for protection against electrostatically generated discharges. In other words, the at least one doped region or ESD region may be formed as ESD implantation.

Figure 1A:
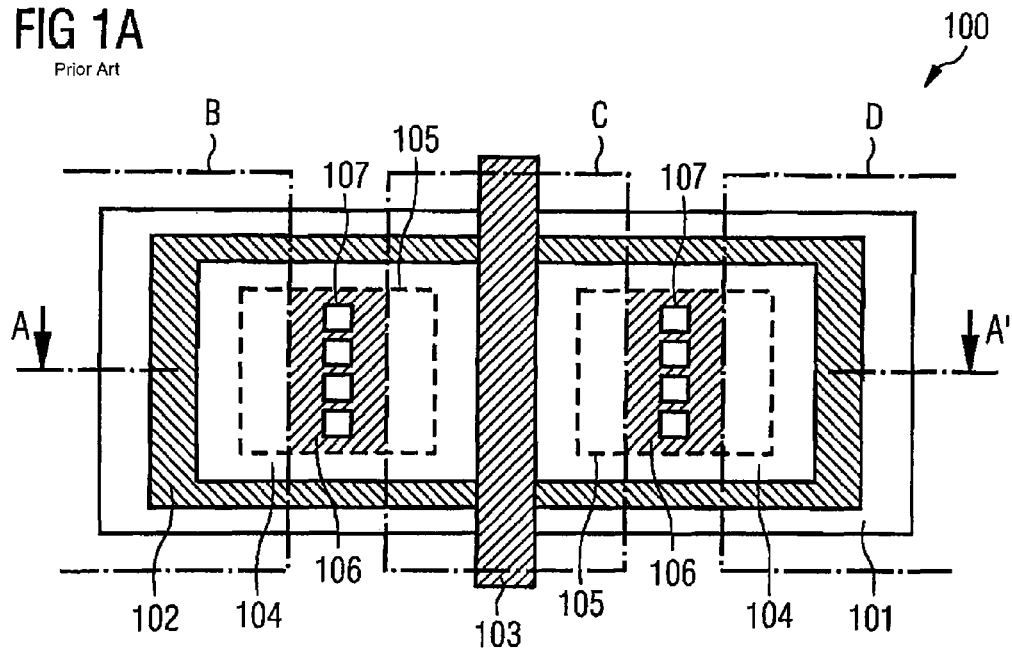
FIG. 1A and FIG. 1B show a schematic construction of one embodiment of a conventional field effect transistor.
Figure 1B:
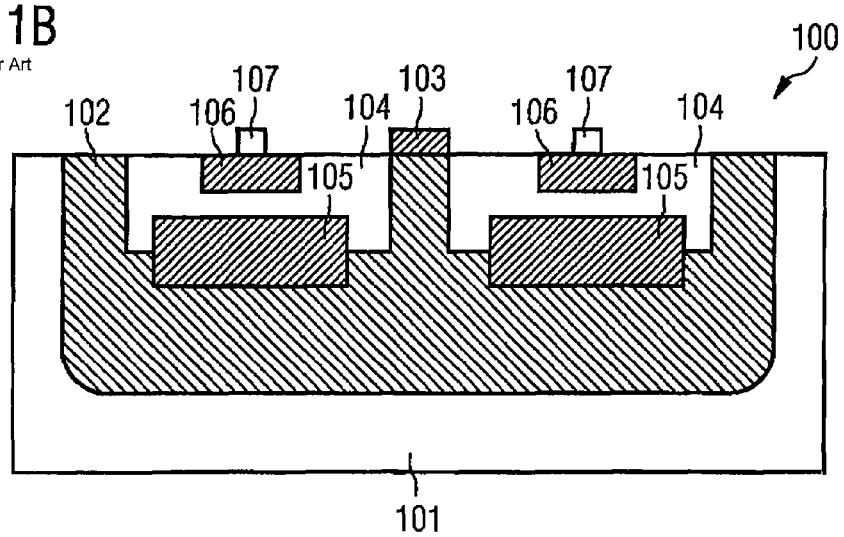

One insight which may be understood as underlying one or more exemplary embodiments of the invention is that a leakage current in an electronic component with ESD implantation and a conventional layout such as, for example, the field effect transistor 100 illustrated in FIG. 1A and FIG. 1B, is caused by defects and/or dislocations in the well region 101. In this case, defects and dislocations in the well region are understood as, for example, a deviation from the regular crystal lattice structure of the substrate material, for example a deviation from the regular diamond lattice structure in the case of a silicon substrate. Said defects and/or dislocations in the well region arise for example as a consequence of the doping with doping atoms if the doping atoms are introduced with the aid of an ion implantation method.

The defects and/or dislocations generated by the implantation of doping atoms in the well region are electrically activated by a subsequent ESD implantation and also further process steps and thus bring about a leakage current in the electronic component. To put it another way the defects/dislocations in the well region form leakage current paths which become electrically active via the ESD implantation.

Another insight which may be understood as underlying one or more exemplary embodiments of the invention is that the leakage current in an electronic component, which leakage current is caused by the occurrence of defects and/or dislocations in the well region, can be virtually completely removed if the well region doping is permanently blocked at least below one ESD region (or one ESD implantation) or at least below a plurality of ESD regions (ESD implantations) in the electronic component, that is to say that the same doping as in the substrate is assumed in the electronic component at least below the one ESD region or at least below the plurality of ESD regions. What is achieved, therefore, by means of the blocking of the well region doping is that the same doping as in the rest of the well region does not prevail at least below the one ESD region or at least below the plurality of ESD regions. In the case of doping with the aid of an ion implantation method, the blocking of the well region doping may be achieved using a doping mask, by way of example.

The reduction of the leakage current can essentially be attributed to the fact that due to the blocking of the well region doping, the formation of dislocations or defects is prevented at least below the ESD regions (ESD implantations).

In accordance with exemplary configurations of the invention, a novel method for producing an electronic component is provided, in which case the occurrence of defects and/or dislocations in the well region, which defects and/or dislocations may lead to an undesirable leakage current in the electronic component, can be suppressed by means of the method for example by virtue of a well region doping being suppressed or blocked at least below one ESD region throughout the duration of the method, so that both throughout the duration of the method and after the method has been concluded, the doping intensity in the blocked region(s) corresponds to the doping intensity of the substrate.

In accordance with one configuration of the invention, a substrate is provided during the method for producing an electronic component, which substrate is formed for example from carbon and/or silicon and/or germanium and/or a IV-IV semiconductor material and/or a III-V semiconductor material and/or a II-VI semiconductor material.

In accordance with another configuration, it is provided that the substrate is formed from a IV-IV semiconductor material, in which case the IV-IV semiconductor material may be SiC and/or SiGe, by way of example.

In accordance with another configuration of the invention, the substrate is doped by means of doping with doping atoms, in which case the substrate may be p-doped or n-doped. The substrate may be p-doped for example by introducing boron atoms, and the substrate may be n-doped for example by introducing nitrogen atoms and/or arsenic atoms and/or phosphorus atoms. The doping of the substrate may be effected for example with the aid of an ion implantation method.

In accordance with another configuration of the invention, in the context of the method for producing an electronic component, one or more doped well regions are formed in a substrate by means of doping with doping atoms. In this case, the individual well regions may be p-doped or n-doped. In the case of a plurality of well regions, a first well region may be p-doped, for example, and a second well region may likewise be p-doped or else n-doped. Conversely, both the first well region and the second well region may be n-doped. It should be noted in this connection that the designation of the well regions is arbitrarily interchangeable and does not imply fixed numbering. The above considerations also apply analogously to the formation of more than two well regions.

In accordance with another configuration of the invention, the formation of one or more well regions is effected with the aid of an ion implantation method. The p-doping of one well region or a plurality of well regions may be effected for example by introducing boron atoms, while a possible n-doping of one well region or a plurality of well regions may be effected for example by introducing nitrogen atoms and/or arsenic atoms and/or phosphorus atoms.

In accordance with another configuration of the invention, in a method for producing an electronic component, the well region doping is suppressed, or in other words blocked, at predefined locations of substrate.

What is achieved by the blocking of the well region doping at the predefined locations of the substrate is that at these locations the doping intensity corresponds to that of the substrate and not to that of the rest of the well region or the rest of the well regions.

In another configuration of the invention, provision is made for realizing doping of the well region or the well regions with the aid of an ion implantation method, or by ion implantation for short. The blocking of the well region doping at predefined locations of the substrate may be achieved for example by using a doping mask or implantation mask during the ion implantation.

In accordance with another configuration of the invention, the blocking of the well region doping is effected at least at the locations in the substrate which lie below at least one additional doped region to be formed in a further process step. In one implementation, a portion of the substrate is below a doped region if the portion of the substrate is positioned beyond a virtual plane extending from a lower edge of the doped region when a cross-section of the substrate and doped region are viewed from a lateral direction. In this case, the at least one additional doped region to be formed in the further process step may be formed as an ESD region or ESD implantation, which ESD region serves for protection against electrostatically generated discharges.

What is achieved by blocking the well region doping at least below the additional doped regions formed as an ESD region is that defects and/or dislocations which can be activated during a subsequent process step and can lead to an undesirable leakage current are not formed below the ESD regions to be formed in a further process step.

In the context of the method for producing an electronic component, it is furthermore provided that at least one connection region of the electronic component is formed in the substrate by means of doping with doping atoms. In this case, the connection regions may be p-doped or n-doped, analogous considerations to the considerations with regard to the doping of the well regions being applicable with regard to the doping of the individual connection regions, that is to say that exclusively n-doped connection regions or exclusively p-doped connection regions may be formed, or at least one p-doped connection region and at least one n-doped connection region may be formed. The doping may be effected with the aid of an ion implantation method, by way of example, in which case a p-doping of a connection region may be achieved for example by introducing boron atoms into the substrate, and an n-doping may be achieved for example by introducing nitrogen atoms and/or arsenic atoms and/or phosphorus atoms.

Furthermore, in the context of the method for producing an electronic component, the formation of at least one additional doped region is provided, the at least one additional doped region being formed by means of doping with doping atoms. It is furthermore provided that the at least one additional doped region is formed at least below one or at least below a plurality of connection regions of the electronic component.

It is provided that the at least one additional doped region is formed as an ESD region, which ESD region serves for protection against electrostatically generated discharges. Clearly, the at least one doped region which is formed in the context of the method for producing an electronic component may be an ESD implantation.

In accordance with another configuration of the invention, it is provided that the at least one connection region of the electronic component, which electronic component has been produced by means of a method for producing an electronic component, is electrically contact-connected.

In accordance with another configuration, the at least one connection region is electrically contact-connected by means of forming at least one salicide layer.

In accordance with another configuration of the invention, it is provided that a salicide layer, which salicide layer serves for making electrical contact with a connection region of the electronic component, is formed using a mask.

In accordance with another configuration of the invention, the electronic component is formed as a field effect transistor. In this case, the field effect transistor may be a MOS field effect transistor; specifically, the field effect transistor may be a PMOS field effect transistor or an NMOS field effect transistor.

In another configuration of the invention, it is provided that the electronic component is formed as an NMOS field effect transistor. In this case, the substrate is p-doped, where the substrate doping may be between $10^{15}$ cm$^{-3}$ and $10^{18}$ cm$^{-3}$ by way of example. Furthermore, the well region is p-doped, where the well region doping may be between $10^{16}$ cm$^{-3}$ and $10^{19}$ cm$^{-3}$, by way of example, the connection regions are n-doped, where the doping of the connection regions may be between $10^{17}$ cm$^{-3}$ and $10^{21}$ cm$^{-3}$, by way of example, and the additional doped regions formed as ESD regions are p-doped, where the doping of the ESD regions may be between $10^{15}$ cm$^{-3}$ and $10^{20}$ cm$^{-3}$, by way of example.

In accordance with another configuration of the invention, it is provided that the electronic component is formed as a PMOS field effect transistor. In this case, the substrate is n-doped, where the substrate doping may be between $10^{15}$ cm$^{-3}$ and $10^{18}$ cm$^{-3}$ by way of example. Furthermore, the well region is n-doped, where the well region doping may be between $10^{16}$ cm$^{-3}$ and $10^{19}$ cm$^{-3}$, by way of example, the connection regions are p-doped, where the doping of the connection regions may be between $10^{17}$ cm$^{-3}$ and $10^{21}$ cm$^{-3}$, by way of example, and the additional doped regions formed as ESD regions are n-doped, where the doping of the ESD regions may be between $10^{15}$ cm$^{-3}$ and $10^{20}$ cm$^{-3}$, by way of example.

In accordance with another configuration of the invention, it is provided that the electronic component is formed as a diode, in which case the diode may be a pn diode or a pin diode or a Schottky diode.

In accordance with another configuration of the invention, the electronic component is formed as a bipolar transistor.

In accordance with another configuration of the invention, a method for producing an electronic component is provided, the method comprising: doping a substrate by means of introducing doping atoms; forming at least one connection region of the electronic component in the substrate; forming at least one additional doped region at least below the at least one connection region, the at least one additional doped region being formed as an ESD region, which ESD region serves for protection against electrostatically generated discharges; and forming at least one well region in the substrate, the well region doping being blocked at least below the at least one additional doped region in such a way that the doping intensity in each blocked region remains unchanged until the end of the production of the electronic component.

One advantage of the invention may be seen in the fact that, in accordance with exemplary configurations of the invention, an electronic component with an ESD protection device is provided, in which electronic component disadvantageous effects such as, for example, a great increase in the leakage current or a great variation of the leakage current are reduced.

In the fabrication of modern electronic components it is necessary to protect the sensitive components against being damaged by electric currents, which electric currents may arise as a result of electrostatic discharges (ESD for short) in a component. For example in the case of integrated circuits comprising semiconductor components such as, for example, diodes or transistors, ESD constitutes one of the most frequent causes of failure.

By way of example, the gate connection of a MOS transistor (metal oxide semiconductor) has a very high input resistance of the order of magnitude of $10^{12}\Omega$-$10^{13}\Omega$. Furthermore, the breakdown voltage of the gate oxide is approximately 10 V-20 V, the breakdown voltage likewise decreasing as the thickness of the oxide layer decreases. On the other hand, electrostatic charging of the machines or humans involved in the fabrication of electronic components can give rise to the electrostatic potentials of the order of magnitude of 1.5 kV.

Contact between an electrostatically charged machine or an electrostatically charged human having an electrostatic potential of the order of magnitude mentioned above and the input terminal of a MOS transistor or some other electronic component can therefore easily trigger an electrostatic discharge (ESD) with possible fatal consequences (i.e. total failure) for the component.

FIG. 1A and FIG. 1B schematically show a conventional construction of a field effect transistor 100 having two ESD regions or ESD implantations 105, which serve for protection against electrostatically generated discharges, first as a plan view (FIG. 1) and also as a cross section (FIG. 1B) along the broken sectional line A-A' in FIG. 1A.

The field effect transistor 100 is formed by forming a doped well region 102 in a substrate 101 by means of doping with doping atoms. The well region 102 is p-doped in the case of an n-channel field effect transistor, and the well region 102 is correspondingly n-doped in the case of a p-channel field effect transistor. The field effect transistor 100 shown in FIG. 1A and FIG. 1B furthermore has two source/drain connection regions 104, which can be electrically contact-connected via in each case a salicide region 106 and one or more contact holes 107.

The saliciding may be effected for example with the aid of a mask in such a way that the regions B, C and D marked by dotted lines in FIG. 1A are excluded, i.e. blocked, from the saliciding.

The two source/drain connection regions 104 are n-doped in the case of an n-channel field effect transistor, and they are correspondingly p-doped in the case of a p-channel field-effect transistor. The field effect transistor 100 furthermore has a gate connection region 103.

An ESD region or an ESD implantation 105 is respectively formed below each of the two source/drain connection regions 104 by means of doping with doping atoms, which ESD region 105 serves for protection against electrostatically generated discharges. The two ESD regions 105 lying below the source/drain connection regions are indicated by dashed lines in the plan view in FIG. 1A. The ESD regions 105 are p-doped in the case of an n-channel field effect transistor and the ESD regions 105 are correspondingly n-doped in the case of a p-channel field effect transistor.

The effect of the ESD regions or ESD implantations 105 consists, then, in reducing the breakdown voltage below the ESD regions 105. As a result, the protective effect is improved and the current is homogenized and drawn away from the sensitive gate connection region 103 into the depth.

What is disadvantageous about the ESD implantation formed in conventional fashion is an often drastically increased leakage current of the transistor and also a great variation of the transistor characteristics.

Figure 2:
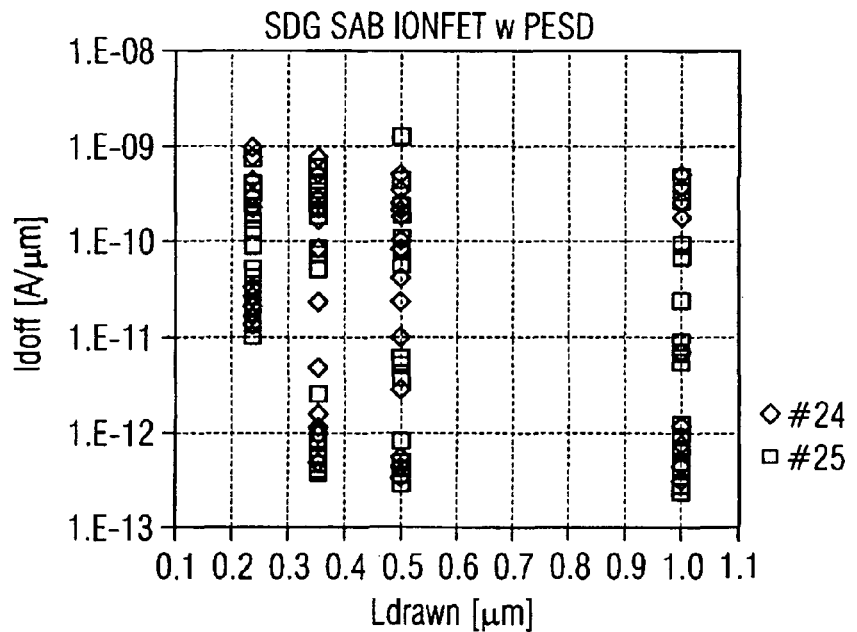
FIG. 2 shows the dependence of a leakage current on a the channel length in NMOS transistors with ESD implantation and a conventional layout.

FIG. 2 shows the dependence of the leakage current $I_{doff}$ of the channel length $L_{drawn}$, that is to say the distance between the two source/drain connection regions, for NMOS transistors with ESD implantation and a conventional layout, that is to say a layout as shown schematically in FIG. 1A and FIG. 1B. The illustration shows that, apart from very small channel lengths, the leakage current varies very greatly independently of the channel length, in part over up to four orders of magnitude. In particular, the leakage current is not observed to decrease systematically as the channel length increases.

Figure 3:
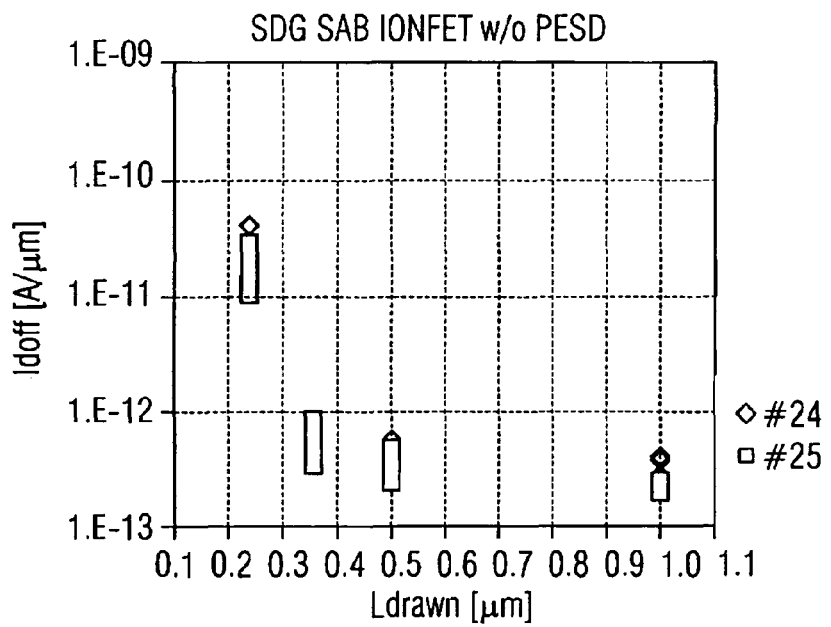
FIG. 3 shows the dependence of a leakage current on a the channel length in NMOS transistors without ESD implantation and a conventional layout.

FIG. 3 by contrast, shows the dependence of the leakage current $I_{doff}$ on the channel length $L_{drawn}$ for NMOS transistors without ESD implantation. A significantly smaller variation of the leakage current can be discerned, which is distinctly less than one order of magnitude for all channel lengths investigated. Furthermore, in contrast to the behavior of NMOS transistors with ESD implantation as illustrated in FIG. 2, the leakage current is observed to decrease systematically as the channel length increases for NMOS transistors without ESD implantation.

Figure 4:
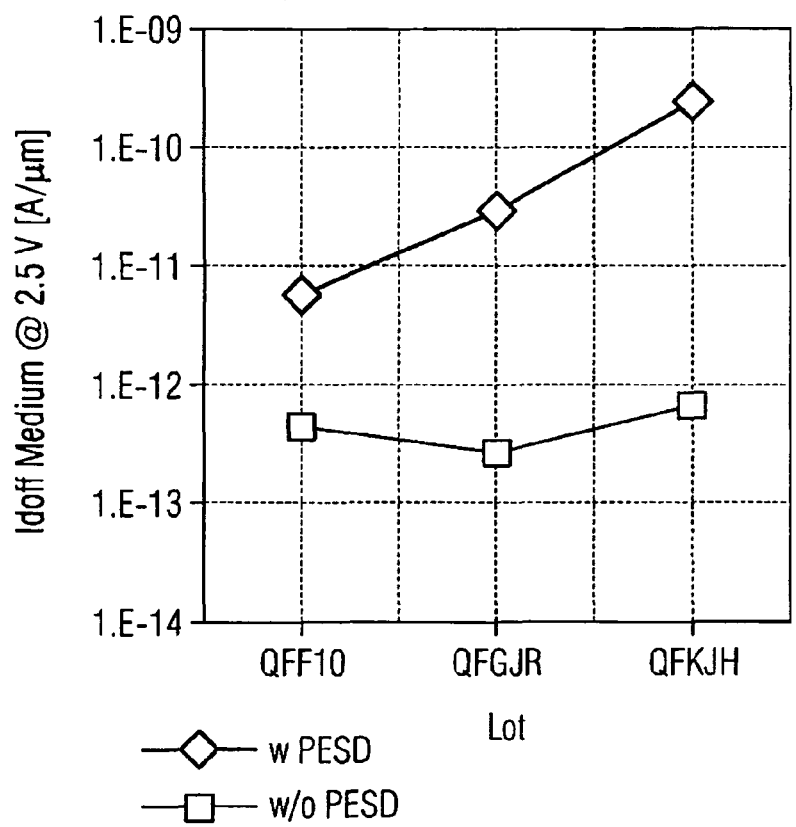
FIG. 4 shows the average leakage currents for NMOS transistors with and without ESD implantation for different fabrication batches.

In FIG. 4, the average leakage currents $I_{doff\_Medium}$ of transistors without ESD implantation (squares) and of transistors with ESD implantation (rhombi) and a conventional layer are plotted, the average values having been determined for three different production batches (lots) in each case. It can be discerned that for all the production batches, the average leakage currents of the transistors with ESD implantation are significantly higher than the average leakage currents of the transistors without ESD implantation, the difference being at least one order of magnitude and, in the case of one of the three production batches, more than two orders of magnitude.

FIG. 2 to FIG. 4 reveal that the use of ESD implantations for protection against electrostatically generated discharges in electronic components using a conventional layout affords advantages only to a limited extent, since the ESD protective effect obtained is accompanied by negative side effects such as a significantly increased leakage current and a great variation of the leakage current. The increased leakage current in electronic devices with ESD implantation and a conventional layout makes it considerably more difficult to apply these devices in products with a low current consumption (e.g. base band products) and in circuits sensitive to leakage current (e.g. analog circuits). Furthermore, the leakage current can only be inadequately modeled on account of its statistical behavior.

It should be mentioned at this point that the considerations explained above on the basis of the example of a field effect transistor can be applied analogously to other electronic components, in particular other semiconductor components, such as, for example diodes (pn-diode, pin-diode, Schottky-diode) or bipolar transistors.

Figure 5:
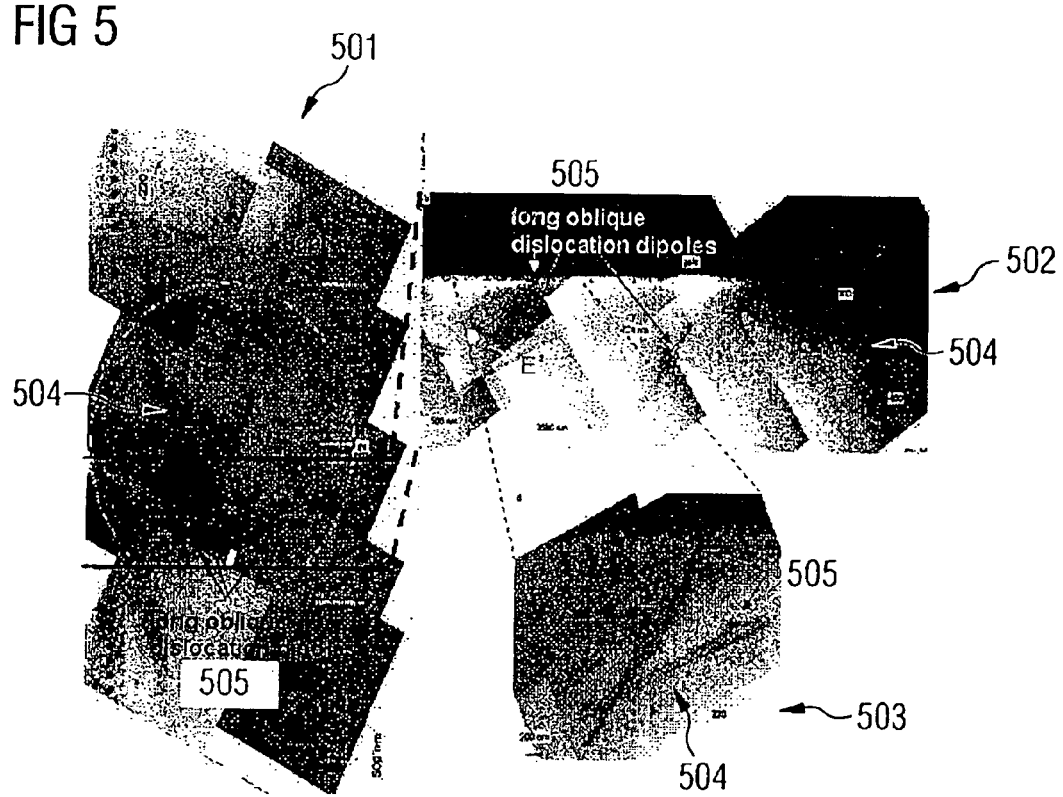
FIG. 5 shows transmission electron micrographs of a p-doped well region.

FIG. 5 shows a TEM (transmission electron microscopy) micrograph 501 of a p-doped well region 504 of a field effect transistor as plan view, the thickness of the sample examined being 3 μm. Dislocations or defects 505 in the lattice structure in the p-doped well region 504 can be discerned as dark lines in the TEM micrograph 501.

Furthermore, FIG. 5 depicts an enlarged view of a cross section 502, which cross section 502 originates from the region between the two solid lines in the TEM micrograph 501. The cross section 502 was likewise recorded by means of TEM, and the thickness of the sample examined was 2 μm. The dislocations or defects 505 in the p-doped well region 504 can again be discerned as dark lines in the micrograph of the cross section. It can furthermore be seen from the TEM micrograph 501 and the TEM micrograph 502 that the dislocations or defects 505 in the p-doped well region 504 run at an angle with respect to the substrate surface, that is to say that the dislocations or defects 505 run obliquely with respect to the substrate surface; in particular, the dislocations or defects 505 run neither parallel nor perpendicular to the substrate surface.

FIG. 5 furthermore shows a detail enlargement 503 of the TEM micrograph of the cross section 502, in which detail enlargement 503 the dislocations or defects 505 are identified as dark lines.

The diagram 600 in FIG. 6 shows the distribution of the leakage current $I_{leak}$ of $n^+$-type diffusions in n-channel transistors with ESD implantation and various production processes. The intensity of the leakage current is plotted on the abscissa, while the percentage of transistors is plotted on the ordinate, which transistors have a leakage current that is less than or equal to the corresponding value on the abscissa, that is to say that the diagram 600 in FIG. 6 shows a cumulative frequency distribution of the leakage currents.

It can be inferred from FIG. 6 that approximately 40% of the transistors produced using a conventional process sequence (identified by the measurement curve 605 in the diagram) have a greatly increased leakage current. By varying the process parameters such as, for example, the implantation dose or the implantation energy (identified by the measurement curves 602, 603, 604 and 606 in the diagram), the proportion of devices having a high leakage current can in part be reduced somewhat, but the basic characteristic remains unchanged. Furthermore, the ESD strength of the electronic devices is greatly reduced by the methods just mentioned.

The measurement curve 601 in FIG. 6 shows the leakage current characteristic of n-channel transistors, which n-channel transistors were produced by means of a method for producing an electronic component in accordance with an exemplary embodiment of the invention. In accordance with the exemplary embodiment of the method, the well region doping is blocked below the ESD regions of the n-channel transistors. As can be discerned from the measurement curve 601 in FIG. 6, the leakage current can be reduced significantly, that is to say by more than one order of magnitude, as a result of the blocking of the well region (of the p-doped well region in this case) below the ESD implantations. The ESD strength is simultaneously maintained in the case of this method.

The measurement results shown in FIG. 6 show that the blocking of the well region below one ESD region or below a plurality of ESD regions of the electronic component enables the desired reduction of the leakage current to be achieved (cf. the measurement curve 601 in FIG. 6), a high ESD strength simultaneously being obtained.

Exemplary embodiments of the invention are explained in more detail below with reference to FIG. 7A to FIG. 10. The illustrations shown in the figures are schematic and therefore not true to scale.

A description is given below, with reference to FIG. 7A to FIG. 7G, of a method for producing an electronic component, an n-channel field effect transistor in the example shown, in accordance with an exemplary embodiment of the invention.

In order to produce an n-channel field effect transistor 700, in a first process step shown in FIG. 7A, a substrate 701 is provided and is subsequently p-doped by introducing doping atoms. The substrate may be a silicon substrate, by way of example. The doping is effected by ion implantation, for example, and boron atoms, for example, may be used as doping atoms.

Figure 7A:
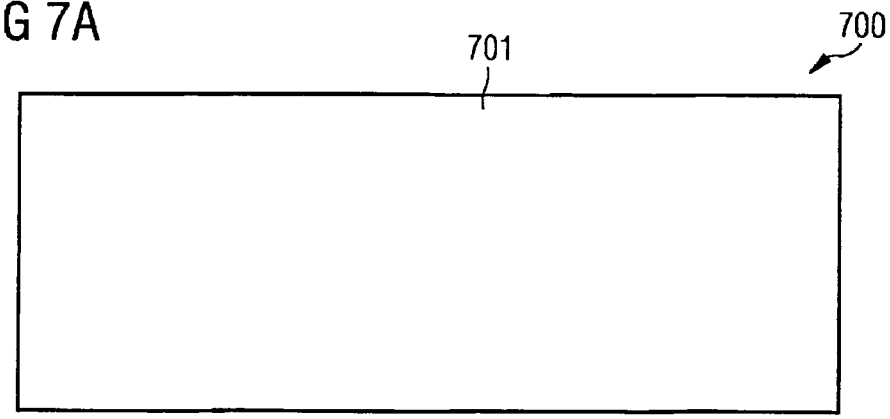
FIG. 7A shows a first process step during one embodiment of a the method for producing an electronic component.
Figure 7B:
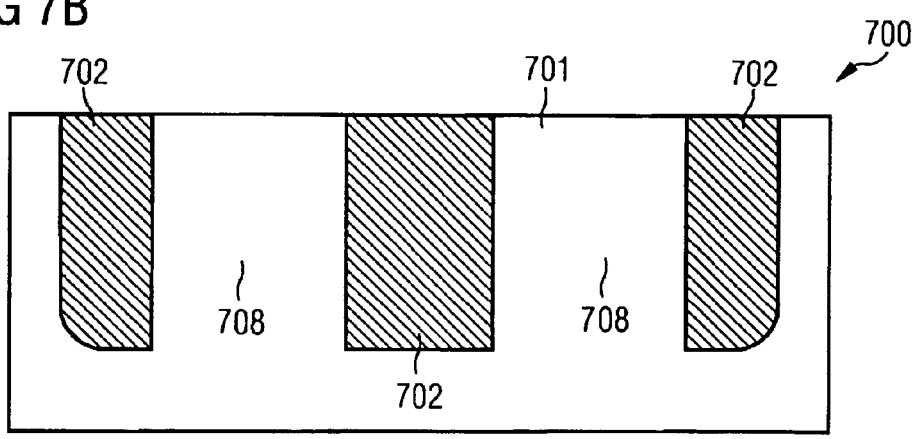
FIG. 7B shows a second process step during one embodiment of the method for producing an electronic component.

In a second process step shown in FIG. 7B, a p-doped well region 702 is formed in the substrate 701 by means of doping with doping atoms. In a manner similar to that when doping the substrate 701, the doping of the well region 702 is effected with the aid of an ion implantation method, and boron atoms may be used as doping atoms. During the doping of the well region 702, predefined regions 708 are excluded or blocked from the well region doping. This is done using a doping mask during the ion implantation. The regions 708 which are excluded or blocked from the well region doping accordingly have the same doping as the substrate 701, whereas the doped well region 702 has a different doping.

Figure 7C:
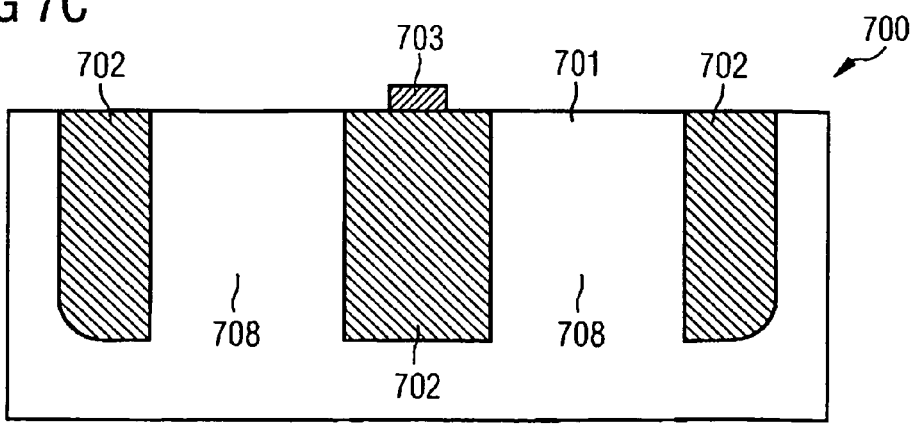
FIG. 7C shows a third process step during one embodiment of the method for producing an electronic component.

In a third process step shown in FIG. 7C, a gate connection region 703 is formed on a central region, to put it another way essentially in the center, of the doped well region. Deposition methods and/or patterning methods may be used for forming the gate connection region 703.

Figure 7D:
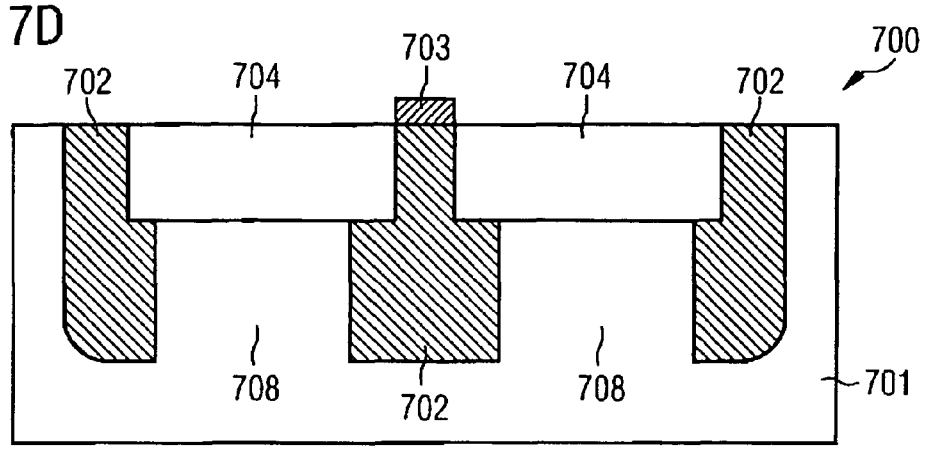
FIG. 7D shows a fourth process step during one embodiment of the method for producing an electronic component.

In a fourth process step shown in FIG. 7D, two n-doped connection regions 704 are formed in the substrate by means of doping with doping atoms, which connection regions 704 serve as source/drain connection regions of the n-channel field effect transistor 700. The doping is effected by ion implantation, for example, and nitrogen atoms and/or arsenic atoms and/or phosphorus atoms, for example, may be used as doping atoms. The two source/drain connection regions 704 are in each case formed above a region 708 blocked from the well region doping.

Figure 7E:
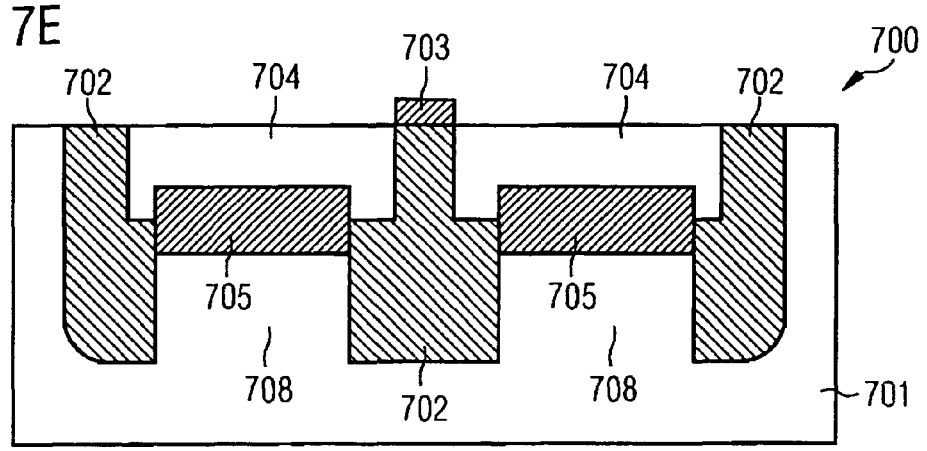
FIG. 7E shows a fifth process step during one embodiment of the method for producing an electronic component.

In a fifth process step shown in FIG. 7E, two additional p-doped regions 705 are formed in the substrate by means of doping with doping atoms, which additional doped regions 705 are formed as ESD regions and serve for protection against electrostatically generated discharges. The doping is effected by ion implantation, for example, and boron atoms, for example, may be used as doping atoms. The two ESD regions 705 are in each case formed below one of the two source/drain connection regions 704 of the field effect transistor 700 in such a way that a region 708 excluded or blocked from the well region doping is respectively formed below each of the two ESD regions 705.

Clearly, then, two layer sequences running from bottom to top are formed, each having a region 708 blocked from the well region doping, an additional doped region 705, which additional doped region 705 is formed as an ESD region, and also a source/drain connection region 704. In the exemplary embodiment shown, the lateral extent of a region 708 blocked from the well region doping is of exactly the same magnitude as the lateral extent of the ESD region 705 formed above it. This does not constitute a necessary property, however. The lateral extent of a region 708 blocked from the well region doping may likewise be larger or else smaller than the lateral extent of the corresponding ESD region 705.

Figure 7F:
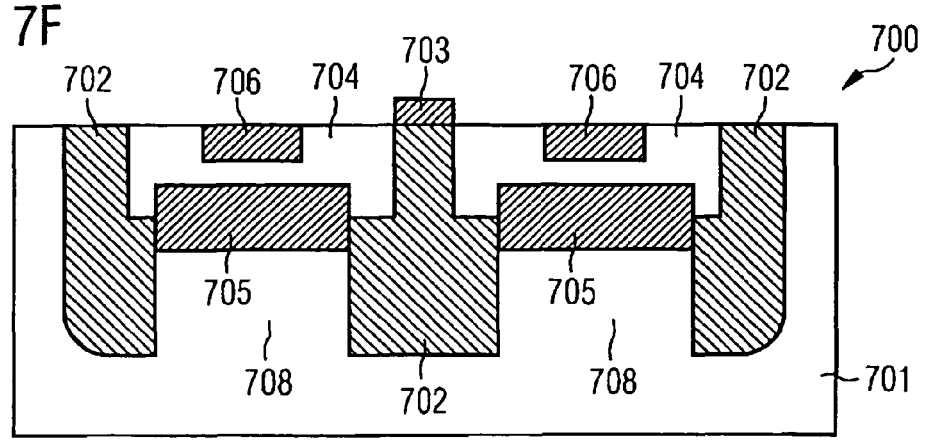
FIG. 7F shows a sixth process step during one embodiment of the method for producing an electronic component.

In a sixth process step shown in FIG. 7F, the two source/drain connection regions 704 of the field effect transistor are electrically contact-connected by saliciding with a respective salicide layer 706. The saliciding may be effected for example using a mask in such a way that predefined regions are excluded, i.e. blocked, from the saliciding.

Figure 7G:
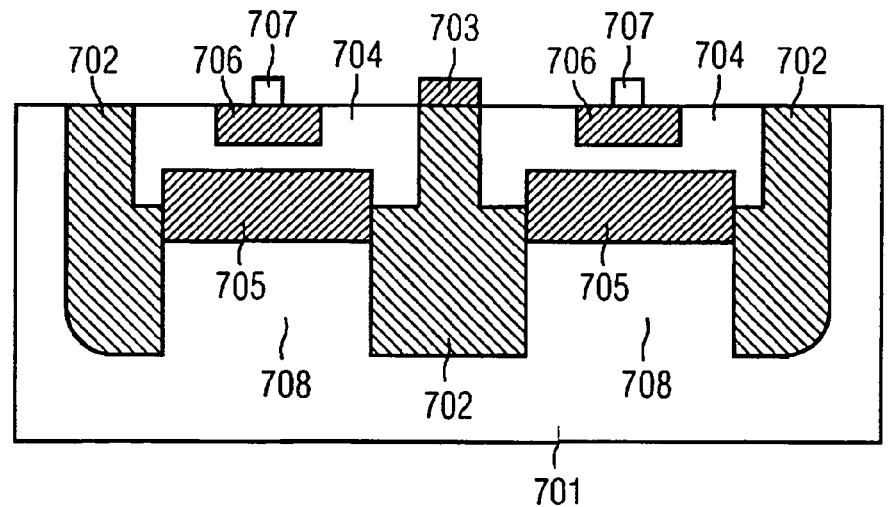
FIG. 7G and FIG. 7H show a schematic construction of one embodiment of a field effect transistor.
Figure 7H:
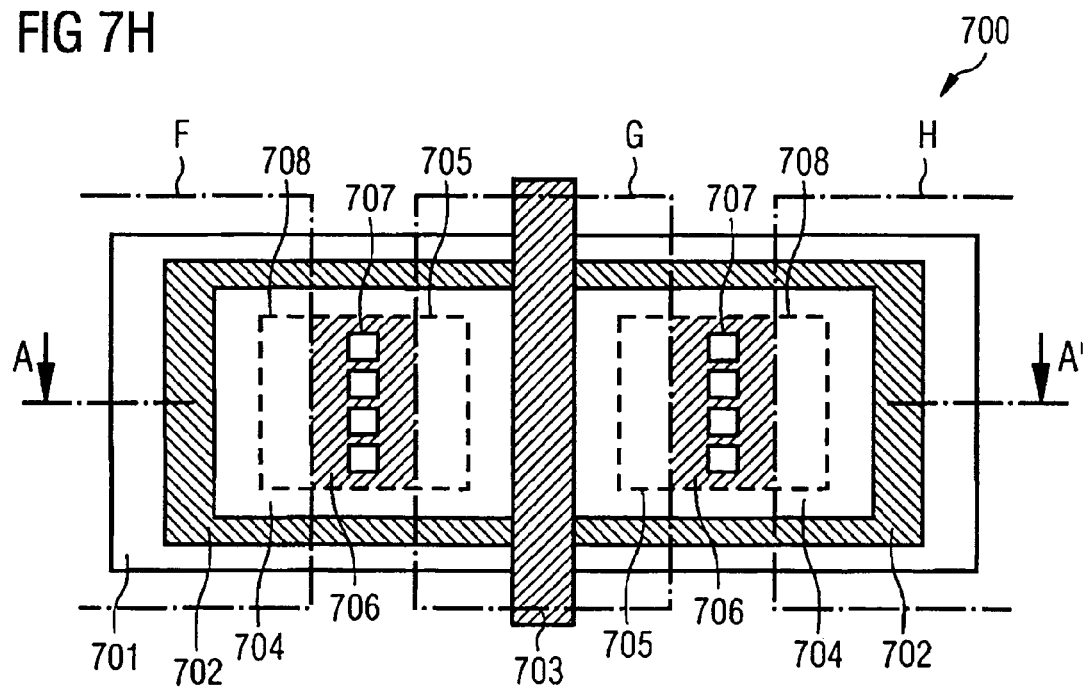

In a seventh process step, the salicide layers 706 formed on the two source/drain connection regions 704 are electrically contact-connected by in each case one or a plurality of contact holes 707. FIG. 7G and FIG. 7H show the field effect transistor 700 after the formation of the contact holes 707. FIG. 7H shows a plan view or layout of the field effect transistor 700 formed by the process steps described above, while the view illustrated in FIG. 7G results as a cross-sectional view along the broken line A-A' in FIG. 7H. The ESD regions 705 concealed by the source/drain connection regions 704 in FIG. 7H and the regions 708 excluded from the well region doping are identified by dashed contour lines. Furthermore, the salicide-blocked regions F, G and H, that is to say the regions which are excluded from the saliciding, are identified by dotted contour lines in FIG. 7H.

Figure 8A:
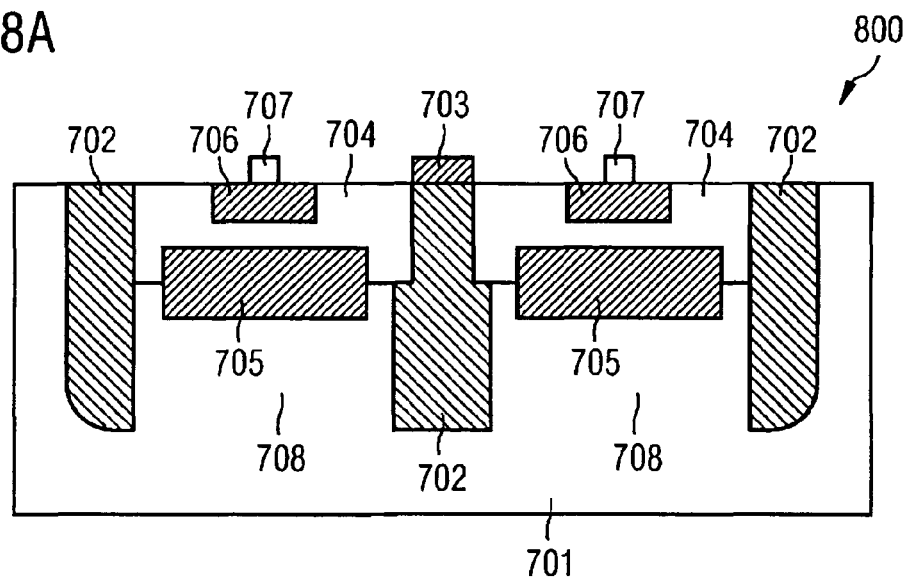
FIG. 8A and FIG. 8B show a schematic construction of another embodiment of a field effect transistor.
Figure 8B:
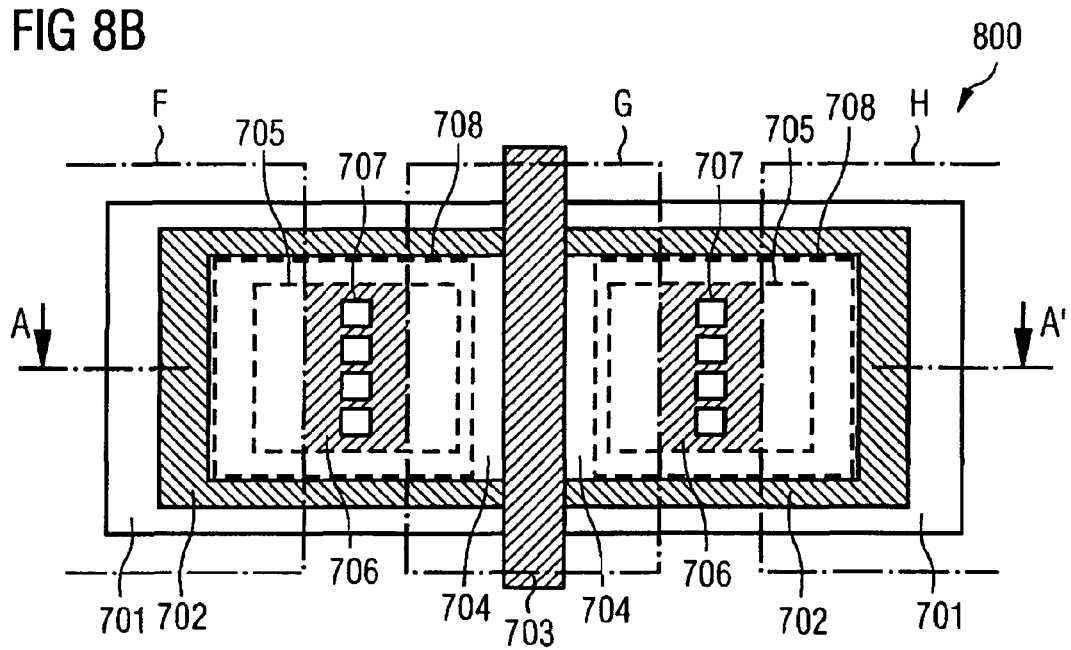

FIG. 8A and FIG. 8B show a further exemplary embodiment of the invention.

An electronic component formed as an n-channel field effect transistor 800 is illustrated, which n-channel field effect transistor 800 is similar to that in FIG. 7A and FIG. 7B. FIG. 8B shows a plan view or layout of the n-channel field effect transistor 800 according to the invention, while the view shown in FIG. 8A results as a cross-sectional view along the broken line A-A' in FIG. 8B.

The essential difference between the n-channel field effect transistor 800 illustrated in FIG. 8A and FIG. 8B and the n-channel field effect transistor 700 illustrated in FIG. 7G and FIG. 7B is that, in the case of the n-channel field effect transistor 800, the regions 708 excluded from the well region doping have a larger lateral extent than the ESD regions 705 formed above them.

Clearly, the regions 708 excluded from the well region doping project laterally beyond the additional doped regions 705 formed as ESD regions, and in accordance with an exemplary configuration of the invention, the regions 708 excluded from the well region doping project laterally beyond the ESD regions 705 by approximately 250 nm.

The larger lateral extent of the regions 708 excluded from the well region doping has the effect that dislocations or defects in the doped well region 702, which dislocations or defects run at an angle with respect to the substrate surface, also do not reach the ESD regions 705.

To express it clearly, then, contact between obliquely running dislocations or defects in the doped well region 702 and the ESD regions 705 is prevented.

Figure 9A:
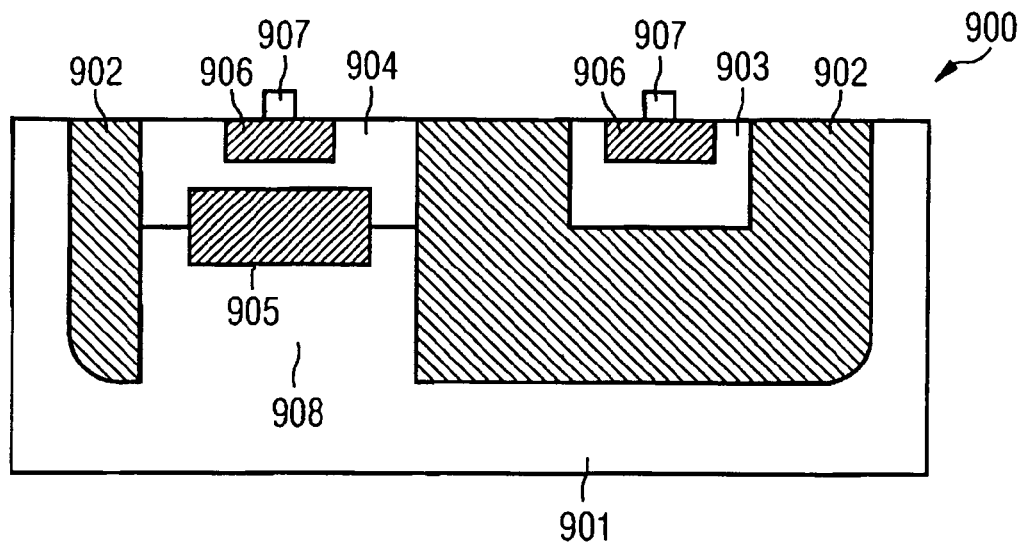
FIG. 9A and FIG. 9B show a schematic construction of one embodiment of a diode.
Figure 9B:
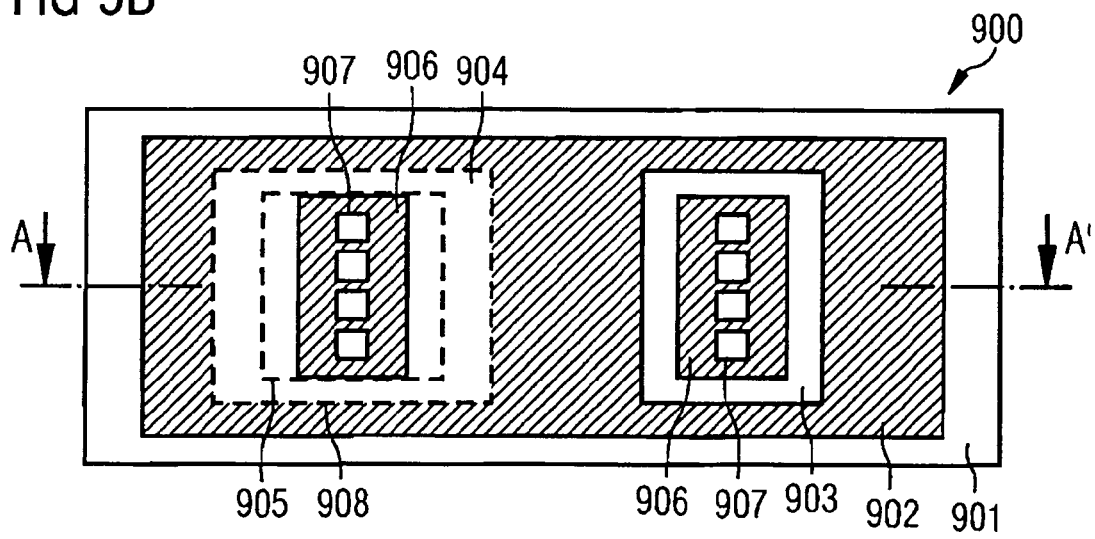

FIG. 9A and FIG. 9B show a diode 900 in accordance with a further exemplary embodiment of the invention. FIG. 9B shows a plan view or layout of the diode according to the invention, while the view shown in FIG. 9A results as a cross-sectional view along the broken line A-A' in FIG. 9B.

The diode 900 has a p-doped substrate 901, a likewise p-doped well region 902 being formed in said substrate 901. Furthermore the diode 900 has a first connection region 903, which first connection region is p-doped, and also a second connection region 904, which second connection region is n-doped. The two connection regions 903 and 904 of the diode 900 are in each case electrically contact-connected by means of a silicide layer 906 and one or a plurality of contact holes 907. An additional doped region 905 is formed below the second n-doped connection region 904, which additional doped region is formed as an ESD region and serves for protection against electrostatically generated discharges. The ESD region 905 concealed by the second connection region 904 is indicated by the dashed line in the plan view in FIG. 9B.

Furthermore, the diode 900 has a region 908 excluded from the well region doping, which region 908 is formed below the ESD region 905 and has a larger lateral extent than the ESD region 905, that is to say that the region 908 excluded from the well region doping projects laterally beyond the ESD region 905. This prevents dislocations or defects running obliquely in the well region 902 from being able to come into contact with the ESD region 905. The region 908 excluded from the well region doping is indicated by the dashed line in the plan view in FIG. 9B.

FIG. 10 shows a bipolar transistor 1000 in accordance with a further exemplary embodiment of the invention. The bipolar transistor 1000 has a p-doped well region 1001, which well region 1001 is formed in a doped substrate (not shown). The doping of the well region 1001 may be effected using an ion implantation method, by way of example. Boron atoms may be used as doping atoms for the doping of the well region 1001. Furthermore, a first n-doped connection region 1002, a second likewise n-doped connection region 1003 and also a p-doped connection region 1004 are formed in the p-doped well region 1001 of the bipolar transistor 1000. The first n-doped connection region 1002 is isolated from the second n-doped connection region 1003 by a first insulation layer 1005, which first insulation layer 1005 may be formed from silicon oxide, by way of example. The first n-doped connection region 1002 furthermore adjoins a second insulation layer 1006 by a side remote from the first insulation layer 1005, which second insulation layer 1006 may be formed from silicon oxide, by way of example. The second n-doped connection region 1003 adjoins the p-doped connection region 1004 by a side remote from the first insulation layer 1005. The p-doped connection region 1004 in turn adjoins a third insulation layer 1007 by a side remote from the second n-doped connection region 1003, which third insulation layer 1007 may be formed from silicon oxide, by way of example. The first n-doped connection region 1002 and the second n-doped connection region 1003 can be electrically contact-connected via one or a plurality of contact-making layers 1008 in each case. An additional p-doped region 1009 is formed below the first n-doped connection region 1002, which additional p-doped region 1009 is formed as an ESD region and serves for protection against electrostatically generated discharges. The well region doping is blocked in the region 1010 outlined by the broken line. The blocking may be effected using a doping mask. It follows from the blocking of the well region doping in the region 1010 that the intensity of the doping in the region below the p-doped ESD region 1009 corresponds to the intensity of the substrate doping. What is achieved by the blocking of the well region doping in the region 1010 is that dislocations or defects which may lead to an undesirable leakage current in the bipolar transistor 1000 cannot form in the region below the ESD region 1009.

Although exemplary configurations and their advantages have been described in detail, it should be noted that diverse changes, replacements and innovations may be made therein without departing from the essence and scope of the invention as defined by the accompanying claims. By way of example, it is readily evident to a person skilled in the art that many of the features, functions, processes and materials which are described herein can be altered in such a way that the alterations made still lie within the scope of the present invention. Furthermore, the scope of the present invention is not intended to be restricted to the specific configurations of the process, the machine, the production, the material composition, the means, the methods and steps which are mentioned in the description. As the average person skilled in the art can readily infer from the disclosure of the present invention, it is possible according to the present invention to use processes, machines, production methods, material compositions, means, methods or steps which exist at the present time or will be developed later and which essentially fulfill the same task or essentially achieve the same result as the corresponding configurations described herein. Accordingly, the accompanying claims are intended to include within their scope such processes, machines production methods, material compositions, means, methods or steps.

It is therefore intended that the foregoing detailed description be regarded as illustrative rather than limiting, and that it be understood that it is the following claims, including all equivalents, that are intended to define the spirit and scope of this invention.

The invention claimed is:

1. An electronic component, comprising:
    a doped substrate;
    at least one doped connection region formed in the doped substrate;
    at least one doped region formed in the doped substrate at least below the at least one doped connection region, the at least one doped region being formed as an ESD region for protection against electrostatically generated discharges;
    at least one well region having a well doping concentration, which is lower than a doping concentration of the doped connection region, formed in the doped substrate; and
    at least one predefined region formed below the at least one doped region;
    wherein the at least one well region is formed in such a way that at least one well region doping is blocked at least below the at least one doped region to form the at least one predefined region and a doping intensity of the at least one predefined region corresponds to a doping intensity of the doped substrate;
    wherein the at least one well region surrounds the at least one predefined region; and
    wherein the at least one well region and the at least one predefined region are doped with the same type of doping atoms.

2. The electronic component of claim 1, wherein the substrate is formed from at least one of Carbon, Silicon, Germanium, a IV-IV semiconductor material, a III-V semiconductor material, and a II-VI semiconductor material.

3. The electronic component of claim 1, wherein the at least one connection region is electrically contact-connected.

4. The electronic component of claim 3, wherein the at least one connection region is electrically contact-connected with the aid of a salicide layer.

5. The electronic component of claim 1, wherein the electronic component is formed as one of a pn diode, a pin diode, or a Schottky diode.

6. The electronic component of claim 1, wherein the electronic component is formed as a bipolar transistor.

7. The electronic component of claim 1, wherein the electronic component is formed as a field effect transistor.

8. The electronic component of claim 7, wherein the electronic component is being formed as a MOS field effect transistor.

9. The electronic component of claim 8, wherein the electronic component is formed as one of an NMOS field effect transistor or a PMOS field effect transistor.

10. The electronic component of claim 9, wherein the electronic component is formed as an NMOS field effect transistor:
  wherein the doped substrate comprises a p-doped substrate, the substrate doping being between a range of $10^{15}$ cm$^{-3}$ and $10^{18}$ cm$^{-3}$;
  wherein the at least one well region comprises a p-doped well region, the well region doping being between a range of $10^{16}$ cm$^{-3}$ and $10^{19}$ cm$^{-3}$;
  wherein the at least one doped connection region comprises n-doped connection regions, a doping concentration of the n-doped connection regions being between a range of $10^{17}$ cm$^{-3}$ and $10^{21}$ cm$^{-3}$; and
  wherein the at least one doped region comprises p-doped ESD regions, a doping concentration of the p-doped ESD regions being between a range of $10^{15}$ cm$^{-3}$ and $10^{20}$ cm$^{-3}$.

11. The electronic component of claim 9, wherein the electronic component is formed as a PMOS field effect transistor:
  wherein the doped substrate comprises an n-doped substrate, the substrate doping being between a range of $10^{15}$ cm$^{-3}$ and $10^{18}$ cm$^{-3}$;
  wherein the at least one well region comprises an n-doped well region, the well region doping being between a range of $10^{16}$ cm$^{-3}$ and $10^{19}$ cm$^{-3}$;
  wherein the at least one doped connection region comprises p-doped connection regions, a doping concentration of the p-doped connection regions being between a range of $10^{17}$ cm$^{-3}$ and $10^{21}$ cm$^{-3}$; and
  wherein the at least one doped region comprises n-doped ESD regions, a doping concentration of the n-doped ESD regions being between a range of $10^{15}$ cm$^{-3}$ and $10^{20}$ cm$^{-3}$.

12. The electronic component of claim 1, wherein the at least one well region comprises one p-doped well region is formed.

13. The electronic component of claim 1, wherein the at least one well region comprises one n-doped well region is formed.

14. The electronic component of claim 1, wherein the at least one well region comprises one of one n-doped well region or one p-doped well region.

* * * * *